United States Patent [19]

Allen et al.

[11] Patent Number: 4,485,487
[45] Date of Patent: Nov. 27, 1984

[54] METHOD OF, AND A RECEIVER FOR, DEMODULATING A DOUBLE SIDEBAND AMPLITUDE MODULATED SIGNAL IN A QUASI-SYNCHRONOUS AREA COVERAGE SCHEME UTILIZING SIDEBAND DIVERSITY

[75] Inventors: Graham Allen, Trowbridge; Robert J. Holbeche, Bath, both of England

[73] Assignee: U.S. Philips Corporation, New York, N.Y.

[21] Appl. No.: 377,633

[22] Filed: May 12, 1982

[30] Foreign Application Priority Data

May 26, 1981 [GB] United Kingdom ............... 8116035

[51] Int. Cl.$^3$ .............................................. H04B 1/26
[52] U.S. Cl. .................................. 455/265; 329/122; 331/12
[58] Field of Search ................... 455/46, 60, 208, 209, 455/202, 257, 258, 260, 265, 316, 59, 61, 203; 329/50, 122, 124, 135; 375/77, 97, 43; 358/188, 195.1; 331/12

[56] References Cited

U.S. PATENT DOCUMENTS

| | | | |
|---|---|---|---|
| 2,817,755 | 12/1957 | Koch ................................ | 455/258 |
| 3,768,030 | 10/1973 | Brown et al. .................... | 455/260 |
| 3,828,138 | 8/1974 | Fletcher et al. ................. | 455/265 |
| 4,100,503 | 7/1978 | Lindsey et al. .................. | 331/12 |
| 4,156,204 | 5/1979 | Hargis ............................. | 331/12 |
| 4,158,174 | 6/1979 | Gruenberger et al. .......... | 329/122 |
| 4,188,589 | 2/1980 | Brown et al. .................... | 329/122 |

Primary Examiner—Marc E. Bookbinder
Attorney, Agent, or Firm—Joseph P. Abate; Edward W. Goodman

[57] ABSTRACT

In order to reduce signal loss particularly when transmitting data in a quasi-synchronous area coverage scheme utilizing sideband diversity, it is necessary to effect coherent demodulation by locking the local oscillator signal to the received carrier signal, even when the carrier has been completely suppressed. The demodulator includes first and second mixers (48, 50) having first inputs to which a frequency converted input signal having sideband diversity is applied. Second inputs of the first and second mixers (48, 50) receive a local oscillator signal. Phase shifting is applied to the input or local oscillator signal so that the outputs of the first and second mixers have a relative phase difference of 90°. The outputs of the first and second mixers are applied to respective audio bandpass filters (56, 58) the outputs of which are mixed in a further mixer (60) to provide a sideband error signal ($E_s$) which is low-pass filtered in a filter (62). A carrier error signal ($E_c$) is derived by low-pass filtering the output of the first mixer (48). A composite error signal $E_{cs}$ is produced from the two error signals ($E_s$ and $E_c$) and is applied to either the local oscillator (52) to lock its frequency and phase to the input signal or to a local oscillator of a preceding frequency conversion stage.

3 Claims, 7 Drawing Figures

METHOD OF, AND A RECEIVER FOR, DEMODULATING A DOUBLE SIDEBAND AMPLITUDE MODULATED SIGNAL IN A QUASI-SYNCHRONOUS AREA COVERAGE SCHEME UTILIZING SIDEBAND DIVERSITY

BACKGROUND OF THE INVENTION

The present invention relates to a method of, and a demodulator for, demodulating a double sideband amplitude modulated (A.M.) signal in a quasi-synchronous (Q.S.) area coverage scheme utilizing sideband diversity.

A Q.S. area coverage scheme is a technique extending the coverage area in mobile radio schemes by simultaneous operation of a number of amplitude modulated transmitters, with overlapping service areas and closely spaced carrier frequencies (within a few Hertz of each other). Such Q.S. area coverage schemes have been used in the United Kingdom for speech communication by major users, such as the police.

Quasi-synchronous operation not only extends the coverage area but intensifies the coverage by overcoming shadowing by terrain features and large buildings. In equal signal strength areas, however, the performance may be degraded by interaction between the several received signals. In areas with no multipath fading, a slow beat occurs between the several received signals and when the resultant signal nulls below the receiver threshold, there is a consequent loss of audio signal. In multipath fading areas, the fading of the individual transmissions will be uncorrelated by virtue of the geographic spacing of the transmitters. However the interaction between the transmissions causes the resultant signal received at the mobile radio to exhibit similar fading characteristics.

The dubious performance of Q.S. schemes in signal overlap areas, that is areas where signals from two or more transmitters overlap, is tolerable with speech transmissions because the redundancy of speech ensures that there is rarely any loss of intelligibility. However, there is a growing demand for medium speed data transmission between the base station and mobiles and interaction between transmissions in Q.S. area coverage schemes can be a major source of errors. Sideband Diversity, described in greater detail in two published articles of which one is entitled "Sideband Diversity: a new application of diversity particularly suited to land mobile radio" published in The Radio and Electronic Engineer, Vol. 48, No. 3, pages 133–139, March 1978 by Professor W. Gosling, J. D. Martin, R. J. Holbeche and G. Allen, and the other of which is entitled "An evaluation of a sideband diversity technique for data transmission on the forward path in a mobile radio area coverage scheme" published in the Radio and Electronic Engineer, Vol. 49, No. 10, pages 521 to 529, October 1979 by G. Allen, R. J. Holbeche and Professor W. Gosling, is a technique that utilizes the redundancy of A.M. signals to overcome the interaction between transmissions in Q.S. schemes and in so doing allows the diversity advantage offered by geographically spaced transmitters to be realized in multipath fading environments.

In a Sideband Diversity scheme, a constant phase shift over the audio frequency band is introduced between the modulation applied to the transmitters by wide-band phase shift networks. In a two transmitter scheme this phase angle would be 90° and the resultant signal (Vr) received by a mobile is described by:

$$Vr = 2v \cdot [\cos \delta\omega_c t/2] \cdot \cos \omega_c t + mv \cdot [\cos(\delta\omega_c t/2 - 45°)] \cdot \quad (1)$$
$$\cos(\omega_c t - \omega_m t - 45°) + mv \cdot [\cos(\delta\omega_c t/2 + 45°)] \cdot$$
$$\cos(\omega_c t + \omega_m t + 45°)$$

where
 v = Common received signal amplitude
 $\omega_c$ = Carrier angular frequency
 m = Modulation index
 $\omega_m$ = Modulation angular frequency, and
 $\delta\omega_c$ = Frequency offset between the transmitters.

The factor in the square brackets in each term of this expression represents the slow modulation caused by receiving two signals with a small frequency offset that is $\pm \delta\omega_c t/2$. However the modulation is no longer identical for the carrier and/or the two sidebands and when one sideband is nulled to zero the other one is at a maximum. Thus the information content of the transmission is no longer periodically destroyed as in conventional Q.S. schemes.

When a vehicle is in motion, the Doppler shift introduced can reduce the offset frequency to zero or increase it to a maximum value of $(\delta\omega_c + 2\omega_d)$ where $\omega_d$ is the Doppler shift, depending upon the direction of motion of the vehicle between the transmitters. Equation (1) can thus be re-written:

$$Vr = 2v \cdot \cos \phi(t)/2 \cdot \cos\omega_c t + mv \cdot \cos(\phi(t)/2 - 45°) \cdot \quad (2)$$
$$\cos(\omega_c t - \omega_m t - 45°) + mv \cdot \cos(\phi(t)/2 + 45°) \cdot$$
$$\cos(\omega_c t + \omega_m t + 45°)$$

Where $\phi$, the radio frequency phase angle, can take on any value between 0° and 360° and may be stationary or not depending upon the offset frequency.

Conventional demodulators cannot be used to demodulate transmissions in sideband diversity operation because, in the case of receiving two equal transmissions, the spectra of the resultant signal changes from a conventional A.M. signal at a radio frequency phase angle $\phi = 0°$ to single sideband at $\phi = 90°$, to a double sideband suppressed carrier at $\phi = 180°$ and to single sideband at $\phi = 270°$. Consequently a demodulator must be capable of coping with these variations in input signal. In order to effect coherent demodulation, it is necessary to provide a reference signal which conveniently can comprise the carrier or can be obtained from the double sideband signal when there is no carrier.

However a carrier locking loop will periodically lose its reference, and hence its lock, when the resultant carrier nulls to zero. Similarly, a system which derives the carrier information from the sidebands will also lose lock when one of the sidebands is zero. This will be illustrated with reference to FIGS. 1 and 2 of the accompanying drawings which show two known types of demodulator.

The block schematic circuit shown in FIG. 1 is known as the 2F, or squaring, loop and comprises an input terminal 10 to which a sideband diversity signal is supplied. This signal is squared in a squaring circuit 12 and the output is filtered in a bandpass filter 14 and applied to one input of a mixer 16. The mixer 16 forms a part of a phase lock loop 18. The loop 18 includes a local oscillator 20 whose frequency is adjustable in response to an error voltage. The output of the oscillator 20 is multiplied by two in a multiplier 22 and applied as a second input to the mixer 16. The output of the mixer 16 is applied to a low-pass filter 24 which produces a voltage which is used for adjusting the frequency of the oscillator 20.

In operation with a sideband diversity input signal as described by Equation 2, the signal obtained from the carrier after squaring and bandpass filtering is:

$$(1+\cos \phi(t)) \cos 2\omega_c t \qquad (3),$$

the carrier signal derived from the sidebands is:

$$(0.5 \cos \phi(t)) \cdot \cos 2\omega_c t \qquad (4),$$

and the composite carrier signal is therefore:

$$(1+1.5 \cos\phi(t)) \cdot \cos 2\omega_c t \qquad (5).$$

This composite signal no longer has a single null at $\phi=180°$ but two nulls occuring at $\phi=132°$ and $\phi=278°$. These phase lock loop will lose lock at these phase angles and is therefore not suitable for sideband diversity operation.

The block schematic circuit shown in FIG. 2 is known as a Costas loop and comprises an input terminal 10 to which the sideband diversity input signal is applied. The input signal is applied to a first input of respective first and second mixers 26, 28. A local oscillator 30, in the form of a voltage controlled oscillator, is connected to the second input of the first mixer 26 and, via a 90° phase shifter 32, to the second input of the mixer 28. The outputs of the mixers 26, 28 are applied to respective bandpass filters 34, 36 which pass the sideband signal components from the respective mixers. These sideband components are mixed in a further mixer 38 to produce an error signal $E_s$. This error signal $E_s$ is filtered in a low-pass filter 40 to provide a voltage for adjusting the frequency of the local oscillator 30 as desired.

With a sideband diversity input signal as described by Equation 2, the Costas loop produces an error signal $E_s$ from the sidebands described by:

$$E_s = m^2 V^2/8 \cdot \cos \phi \cdot \sin 2\theta \qquad (6)$$

where $\theta$ is the phase error in the local oscillator.

If desired, an error signal can be obtained from the carrier by replacing the bandpass filters 34, 36 in the loop arms by low-pass filters. The composite signal so derived suffers from the same problems as those described for the 2F loop and the loop will lose lock at specific values of $\phi$.

SUMMARY OF THE INVENTION

Accordingly it is an object of the present invention to be able to provide a carrier locking loop which will remain locked for all values of $\phi(t)$.

According to one aspect of the present invention there is provided a method of demodulating a double sideband amplitude modulated signal in a quasi-synchronous area coverage scheme utilizing sideband diversity, comprising producing a composite error signal from a received, frequency converted signal, the composite error signal comprising a first error signal derived from a carrier or IF carrier signal and a second error signal derived from the sidebands in the signal, and utilizing the composite error signal to lock the frequency of a frequency controllable local oscillator used in demodulating the received signal.

According to another aspect of the present invention there is provided a receiver for receiving and demodulating a double sideband amplitude modulated signal in a quasi-synchronous area coverage scheme utilizing sideband diversity, the receiver comprising at least one frequency conversion stage and an IF demodulating stage including means for producing a composite error signal comprising a first error signal derived from an input signal to the IF stage and a second error signal derived from sidebands of the input signal, the composite error signal being used to lock the frequency of a frequency controllable local oscillator provided in the frequency conversion stage or the IF stage, to the carrier frequency present at the input of said stage.

An advantage of the present invention over the prior art proposals is that the first error signal forms a carrier tracking loop so that the composite error signal is different and the phase error in the oscillator is able to track from 0° to 90° for values of $\phi$ between 90° and 180°. Consequently the information derived from the carrier and from the average of the sidebands reinforces each other rather than cancels and consequently the data is preserved.

The composite error signal may be applied to a voltage controlled local oscillator of the IF stage or alternatively to a voltage controlled local oscillator of a preceding frequency conversion stage. In the latter case the gain of the voltage controlled local oscillator may be increased.

DESCRIPTION OF THE DRAWINGS

The present invention will now be described, by way of example, with reference to FIGS. 3 to 7 of the accompanying drawings, wherein.

DESCRIPTION OF THE PREFERRED EMBODIMENT

Figure 3:
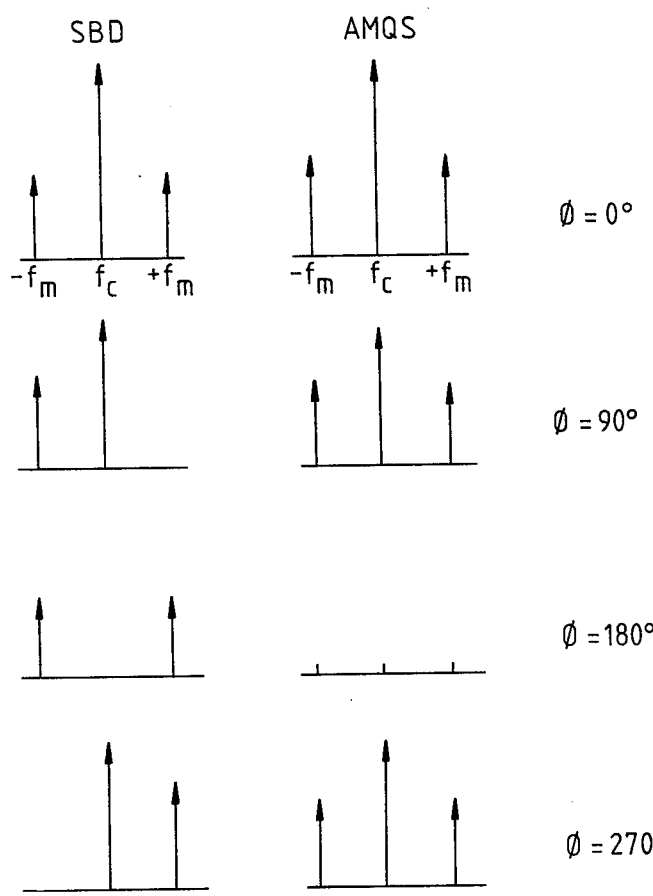
FIG. 3 is a diagram showing the combined spectra for an amplitude modulated quasi-synchronous (AMQS) signal and a sideband diversity (SBD) signal.

In FIG. 3 the carrier signal is referenced $f_c$ and the sideband signals $-f_m$ and $+f_m$ are spaced equally from $f_c$. Looking first at the AMQS spectra, it will be noted that as the R.F. phase angle $\phi$ varies between 90° and 270° the amplitude of the received signal diminishes to zero (that is below the threshold of the radio receiver) at 180°, consequently a carrier locking loop will drop out of lock and any data being transmitted would be lost. In contrast the SBD spectra shows that for $\phi=0°$ there is a conventional AM signal, for $\phi=90°$ there is a single (lower) sideband signal, for $\phi=180°$ there is a double sideband, suppressed carrier signal and for $\phi=270°$ there is a single (upper) sideband signal. Consequently not only there is a signal always present but also it is possible to provide a carrier locking signal, in the case of $\phi=180°$ this locking signal can be derived from the sidebands.

Figure 1:
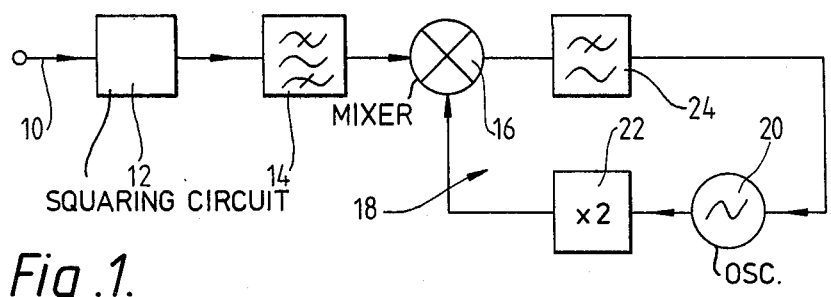
Figure 2:
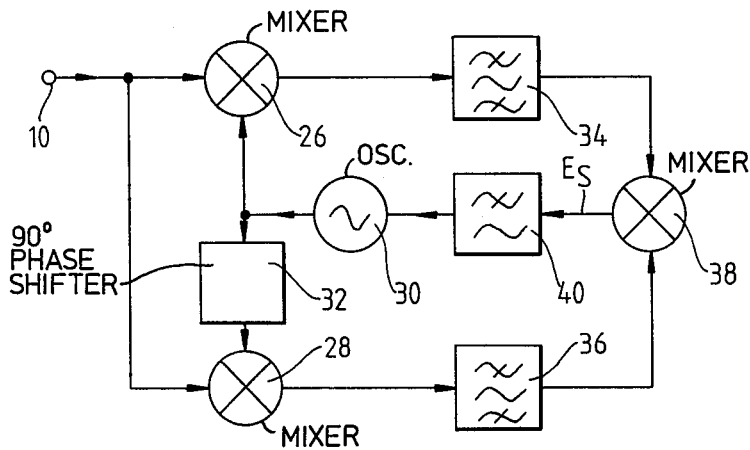
Figure 4:
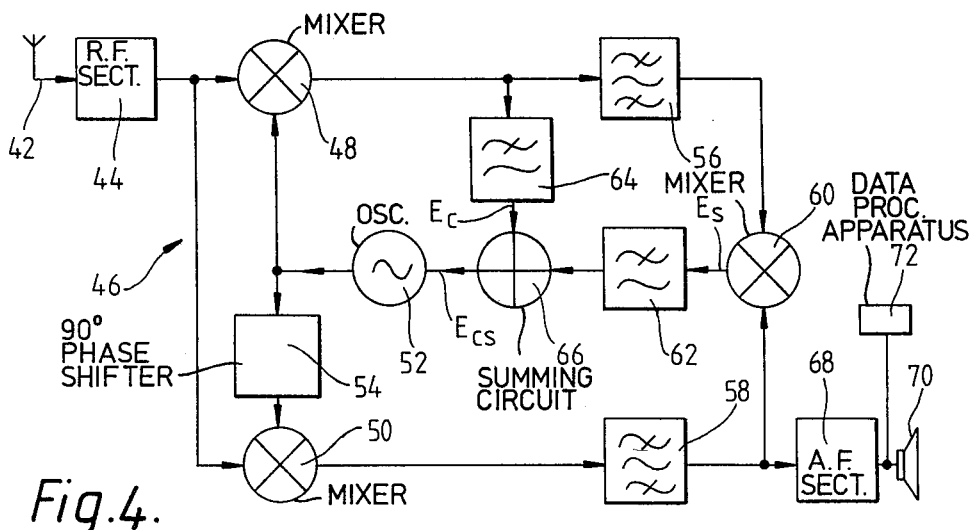
FIG. 4 is a block schematic circuit diagram of a radio receiver made in accordance with the present invention.

FIG. 4 is a block schemtic circuit diagram of a receiver including a demodulator that can remain in lock for values of between 0° and 360°. The receiver includes an aerial 42 connected to an R.F. section 44, the output of which is an IF signal with sideband diversity. This IF signal is applied to a demodulator 46 comprising first and second mixers 48, 50. Also supplied to the mixers 48, 50 is a signal derived from a local oscillator 52, in the case of the signal applied to the mixer 50, it is shifted in phase by 90° in a phase shifter 54. The audio signals in the outputs of the mixers 48, 50 are derived by bandpass filters 56, 58. An error signal, $E_s$, can be obtained from the audio signals by mixing the outputs of the filters 56, 58 in a mixer 60. The error signal $E_s$ is then filtered in a low-pass filter 62.

An error signal, $E_c$, can be obtained from the carrier signal component from the mixer 48 by means of a low-pass filter 64. The two error signals $E_s$ and $E_c$ are combined in a summing circuit 66 to provide a composite error signal $E_{cs}$ which is applied to the local oscillator 52 to lock its frequency to the carrier frequency.

The audio signal, for example speech and/or data, is derived from the output of the bandpass filter 58 by means of an A.F. section 68, the output of which is applied to the appropriate transducer 70 or data processing apparatus 72.

In operation the output of the filter 62 will be the error signal, $E_s$, derived from the sidebands and described by Equation (6) while the output of the filter 64 will be the error signal $E_c$, derived from the carrier and described by:

$$E_c = v \cdot \cos\phi/2 \cdot \sin\theta \qquad (7)$$

$E_s$ is a function of $\cos\phi$ and $E_c$ a function of $\cos\phi/2$ because of the behavior of the input signal. $E_s$ is also a function of $\sin 2\theta$ while $E_c$ is a function of $\sin\theta$ and, with a single input signal ($\phi=0°$) either, error signal could be used to maintain lock at $\theta=0°$.

When the two error signals are combined in the summing circuit 66, lock will then be maintained at $\theta=0°$ for $\phi=0°$ but the phase reference will change as $\phi$ varies the relative amplitudes (and signs) of the two error signal components $E_s$ and $E_c$.

With the gain of the low-pass filters 62, 64 adjusted such that the contributions of the two error signals to the slope of the phase characteristic around $\theta=0°$ ($\phi=0°$) are equal, then there is no possibility of lock occurring at $\theta=180°$ with a single input. Under these conditions the composite error signal, $E_{cs}$ is given by:

$$E_{cs} = K\cos\phi \cdot \sin 2\theta + 2K\cos\phi/2 \cdot \sin\theta \qquad (8)$$

Figure 5:
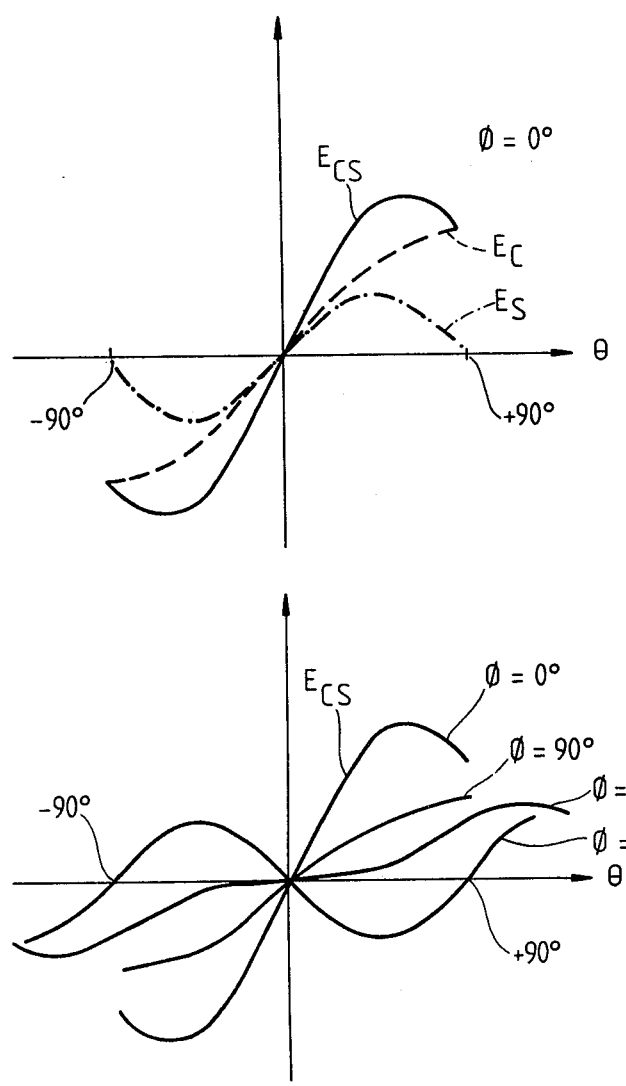
FIG. 5 are graphs illustrating error signal amplitudes for different values of R.F. phase angle $\phi$.

This signal is illustrated in FIG. 5 for various values of $\phi$, where it can be seen from the upper drawing that the consequences of combining the two error signals $E_s$ and $E_c$ is an increase in the slope of the phase characteristic over the region of interest. In FIG. 5 the ordinate represents the error signal amplitude and the abcissa the phase error $\theta$ of the local oscillator.

Referring to the lower drawing, as $\phi$ varies from 0° to 90°, the component of the error signal derived from the sidebands will be reduced (to zero at $\phi=90°$) and the slope of the phase characteristic will be decreased but the loop will maintain lock at $\theta=0°$.

As $\phi$ increases further from 90° to 180°, the sideband derived component $E_s$ of the error signal $E_{cs}$ will increase but with its phase reversed while the carrier component $E_c$ decreases. The stable null at $\theta=0°$ will change to an unstable one (at $\phi=120°$) and the loop will shift its phase reference to $\theta=90°$(or $-90°$) at $\phi=180°$, the stable null will shift towards $\theta=180°$ at $\phi=270°$ and will maintain this value of $\theta$ as $\phi$ increases to 360°. The tracking of the phase reference takes place in the summing circuit 66. By being able to track the phase reference, cancellation of the sidebands is avoided and coherent demodulation is maintained.

Figure 6:
FIG. 6 is a vector diagram of the lower sideband (LSB) and upper sideband (USB) components and the resultant (R) demodulated signal.

The demodulated output of the loop, which is supplied to the AF section 68, is just the input signal described by Equation (2) multiplied by $\cos(\omega_c t + \theta)$, where $\theta$ takes on the values described above, with the resultant signal passed through a bandpass filter. The vector components of the demodulated signal are shown in FIG. 6. In FIG. 6 the lower and upper sideband components are designated LSB and USB, respectively, and their resultant as R. As $\phi$ varies between 0° and 360°, there is no null in the demodulated signal, the amplitude variations being restricted to between 3 and 6 dB.

There is however an unavoidable phase shift of $\theta=90°$ (which is relatively slow compared with the data rate), which may affect some forms of data modulation.

From laboratory tests of comparing the sideband diversity demodulator used in a receiver made in accordance with the present invention with a conventional AM demodulator using audio frequency, frequency shift keying (FSK) at a data rate 1200 bits/second, it was shown that the sideband diversity demodulator is better than the A.M. demodulator by about 8 dB at low signal levels when one signal only is being received; the error rate falling sharply in both cases as the signal level is increased.

When two equals signals (with an offset of 2 Hz) are applied however, the results were very different. Although the sideband diversity performance was degraded by approximately 10 dB, the error rate still improved rapidly as the signal level increased giving an error rate of $2.6 \times 10^{-6}$ for signal levels less than 1 $\mu$V (p.d.). With conventional Q.S. operation, the error performance is extremely poor and improves only slightly with signal level. Similar results were obtained for equal signals with offset frequencies up to 30 Hz.

In the receiver illustrated in FIG. 4, the 90° phase shifter 54 may be replaced by a $+45°$ phase shifter and a $-45°$ phase shifter or any other combination or phase shift angles totalling 90°. Alternatively the local oscillator 52 output may be applied directly to both mixers 48, 50 and the IF signal applied to one of the mixers 48 or 50 being shifted in phase by 90° relative to the IF signal applied to the other of the mixers 50 or 48. Irrespective of the actual means used, it is necessary to ensure a relative phase difference of 90° between the outputs of the mixers 48, 50.

Figure 7:
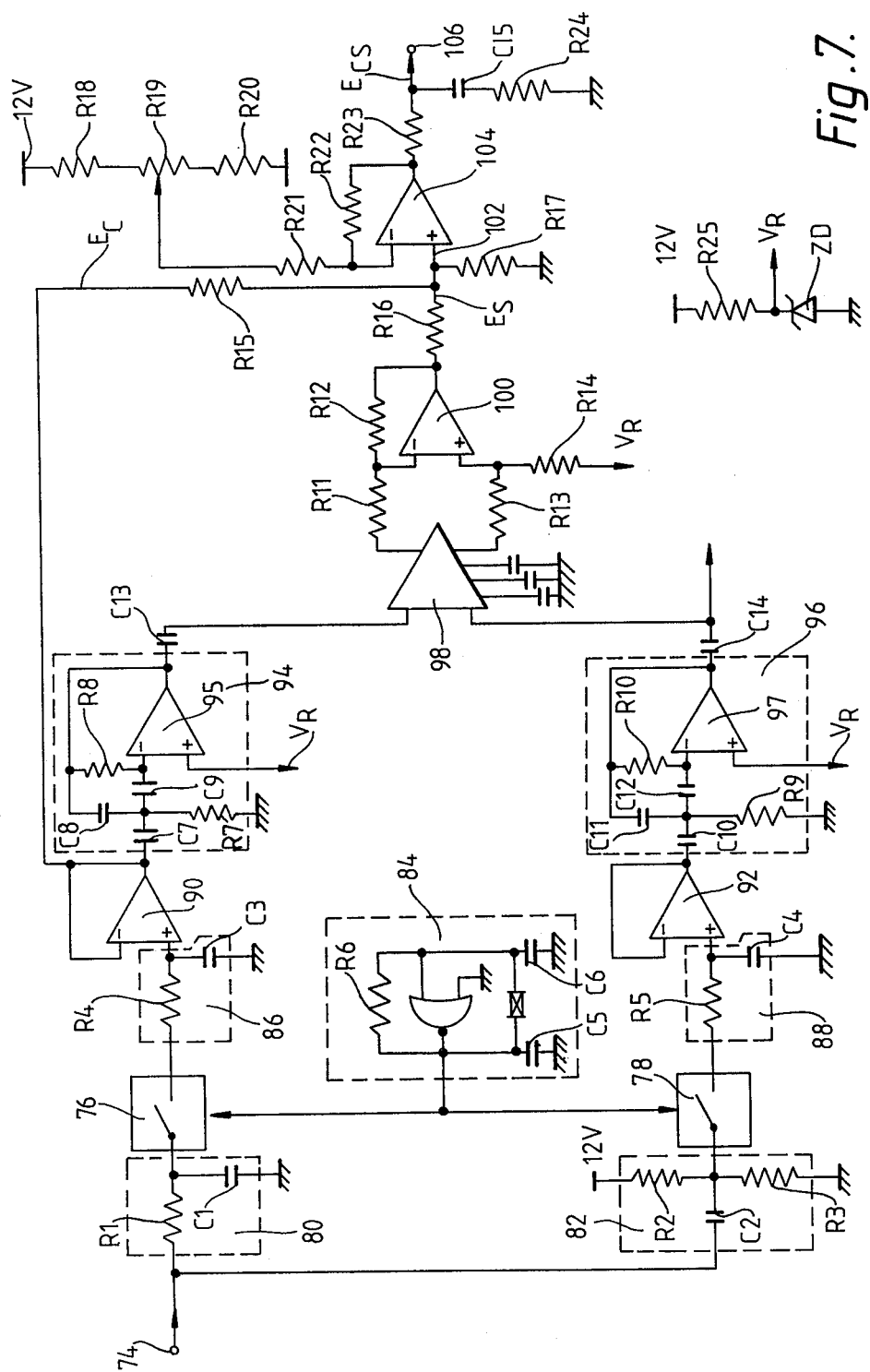
FIG. 7 is a schematic circuit diagram of an embodiment of a demodulator for a radio receiver in accordance with the present invention.

Referring now to FIG. 7 which illustrates an embodiment of a demodulator for a receiver made in accordance with the present invention. Unlike the receiver shown in FIG. 4, the composite error signal $E_{cs}$ is used to adjust the carrier frequency of a voltage controlled crystal oscillator (VCXO) of the first or second conversion oscillator rather than the single frequency crystal oscillator in the illustrated embodiment.

In FIG. 7 a 455 kHz IF signal is applied to an input 74 from where it is applied to first and second mixers 76, 78 constituted by switches. A relative phase shift of 90° is produced in the signal applied to the respective inputs of the mixers 76, 78 by phase shifting networks 80, 82, the network 80 being of an integrating type and the network 82 being of a differentiating type. A 455 kHz crystal local oscillator 84 is also connected to the mixers 76, 78. Since the incoming signals undergo a relative phase shift of 90°, it is unnecessary to shift the phase of the output of the local oscillator 84.

The outputs of the mixers 76, 78 are filtered in low-pass filters 86, 88 and their outputs are passed via buffer amplifiers 90, 92 to the inputs of high-pass filters 94, 96 which pass the audio signals. The filters 94, 96 comprise amplifiers 95, 97 whose inverting inputs receive the signal from the buffer amplifiers 90, 92, respectively, and whose non-inverting inputs receive a reference voltage $V_R$. The two audio signals are mixed in a double balanced mixer 98 to provide the sideband error signal $E_s$ which is amplified in amplifier 100 before being applied to a summing input 102 of a summing amplifier 104.

The carrier error signal $E_c$ derived fom the output of the buffer amplifier 90 is also applied to the summing input 102. The output, composite error signal, $E_{cs}$, of the summing amplifier 104 appears on a terminal 106 from where it is used to adjust the frequency of a VCXO of an earlier converter stage, usually the second converter stage. One advantage of operating on the second converter stage as opposed to the IF stage is that the loop gain can be greater.

In the case of the embodiment illustrated, the components used are of the following type or have the following values:

| R1  | 820     | R5  | 5.1K   |
|-----|---------|-----|--------|
| R2  | 3.9K    | R6  | 1M     |
| R3  | 1.0K    | R7  | 7.5K   |
| R4  | 5.1K    | R8  | 33K    |
| R9  | 11K     | R17 | 220K   |
| R10 | 240K    | R18 | 8.2K   |
| R11 | 10K     | R19 | 1K     |
| R12 | 75K     | R20 | 1K     |
| R13 | 10K     | R21 | 8.2K   |
| R14 | 75K     | R22 | 680K   |
| R15 | 5.6K    | R23 | 82K    |
| R16 | 220K    | R24 | 10K    |
| C1  | 560 pF  | C9  | 33 nF  |
| C2  | 560 pF  | C10 | 33 nF  |
| C3  | 0.01 µF | C11 | 3.3 nF |
| C4  | 0.01 µF | C12 | 33 nF  |
| C5  | 47 pF   | C13 | 2.2 µF |
| C6  | 47 pF   | C14 | 2.2 µF |
| C7  | 33 nF   | C15 | 56 nF  |
| C8  | 33 nF   |     |        |

Mixer 76, 78 - Semiconductor switch type 4016
Double balance mixer 98 - Texas Instruments 76514
Amplifiers 90, 92, 95, 97 - Op amp type SN 72558
Amplifiers 100, 104 - Op amp type SN 72044
Oscillator 84 - CD 4001

The reference voltage $V_R$ applied to the non-inverting inputs of the amplifiers 95, 97 of the high-pass filters 94, 96 and the amplifier 100 is derived from a 12 volt supply by a zener diode ZD and series resistor R25.

Although the present invention has been described with reference to an area coverage system comprising two spaced transmitters, a greater number of transmitters may be used. In the case of three transmitters the phase difference between the modulating signals may be ±120°.

We claim:

1. A receiver for receiving and demodulating a double sideband amplitude modulated signal in a quasi-synchronous area coverage scheme utilizing sideband diversity, the receiver comprising at least one frequency conversion stage for frequency down-converting an input signal and an IF demodulating stage, coupled to said frequency conversion stage, including a frequency controllable local oscillator, first and second quadrature mixers, each having a first input for said down-converted input signal and a second input for a local oscillator signal, means for shifting the phase of the down-converted input signal or the local oscillator signal such that there is a relative phase difference of 90° between the outputs of the first and second mixers, low-pass filtering means coupled to an output of the first mixer, the output of the low-pass filtering means providing a first carrier error signal, first and second band-pass filters having non-zero cutoff frequencies connected respectively to the outputs of the first and second mixers, a further mixer coupled to outputs of the first and second band-pass filters, further low-pass filtering means connected to the output of the further mixer to provide a second sideband error signal, and summing means having inputs to receive said first and second error signals and an output on which a composite error signal appears, the output of the summing means being coupled to said oscillator.

2. A receiver as claimed in claim 1, wherein the low-pass filtering means have respective gains which are adjustable so that the contributions of the first and second error signals to the slope of the phase characteristic of the composite error signal around $\theta=0°$, where $\theta$ is the phase error of the local oscillator, are equal.

3. A method of demodulating a double sideband amplitude modulated signal in a quasi-synchronous area coverage scheme utilizing sideband diversity, the method comprising the steps:
frequency down-converting an input signal,
mixing the frequency down-converted signal in quadrature with a local oscillator frequency in two mixers to provide first and second output signals having a relative phase difference of 90° therebetween,
deriving a first carrier error signal by low-pass filtering the output of one of the two mixers,
deriving a second error signal from the sidebands in the down-converted signal by band-pass filtering the outputs of the two mixers, said band-pass filtering blocking D.C. signal components of said mixer outputs, mixing said band-pass filtered outputs and low-pass filtering the output of said mixing operation,
combining said first and second error signals to form a composite error signal, and
utilizing the composite error signal to lock the frequency of a frequency controllable oscillator used in demodulating the received signal.

* * * * *